United States Patent [19]

Grabbe et al.

[11] 4,116,519
[45] Sep. 26, 1978

[54] ELECTRICAL CONNECTIONS FOR CHIP CARRIERS

[75] Inventors: Dimitry G. Grabbe, Lisbon Falls, Me.; Joseph Patrick Sweeney, Carlisle, Pa.

[73] Assignee: AMP Incorporated, Harrisburg, Pa.

[21] Appl. No.: 821,112

[22] Filed: Aug. 2, 1977

[51] Int. Cl.² .............................................. H01R 13/12
[52] U.S. Cl. ............................ 339/17 CF; 39/176 MP
[58] Field of Search ....... 339/17 CF, 176 M, 176 MP

[56] References Cited

U.S. PATENT DOCUMENTS

| | | | |
|---|---|---|---|
| 3,701,077 | 10/1972 | Kelly, Jr. | 339/176 MP |
| 3,715,629 | 2/1973 | Swengel, Sr. | 339/258 R |
| 3,912,984 | 10/1975 | Lockhart, Jr. et al. | 339/17 CF |
| 4,018,494 | 4/1977 | Scheingold et al. | 339/17 CF |
| 4,028,722 | 6/1977 | Helda | 357/70 |
| 4,045,105 | 8/1977 | Lee et al. | 339/17 CF |

OTHER PUBLICATIONS

Aviation Week & Space Technology, Klass, 1-1977, pp. 49-51.

*Primary Examiner*—Joseph H. McGlynn
*Attorney, Agent, or Firm*—Frederick W. Raring

[57] ABSTRACT

Packaging and interconnecting means for a plurality of microcircuit chips contained in chip carriers comprises a chip carrier socket which is dimensioned to receive a plurality of chip carriers in stacked relationship, one on top of the other. Vertically extending conductors in the socket are contacted by the leads from the chip carriers. In accordance with one embodiment, the several chip carriers are electrically and physically identical and the conductors are shared by all of the chips, excepting one dedicated conductor for each chip carrier. Alternatively, the chips in the chip carriers can be electrically dissimilar in which case only limited numbers of the socket conductors are shared and connections among the several chip carriers in the stack are achieved by interrupting the conductors in the chip carrier socket.

7 Claims, 14 Drawing Figures

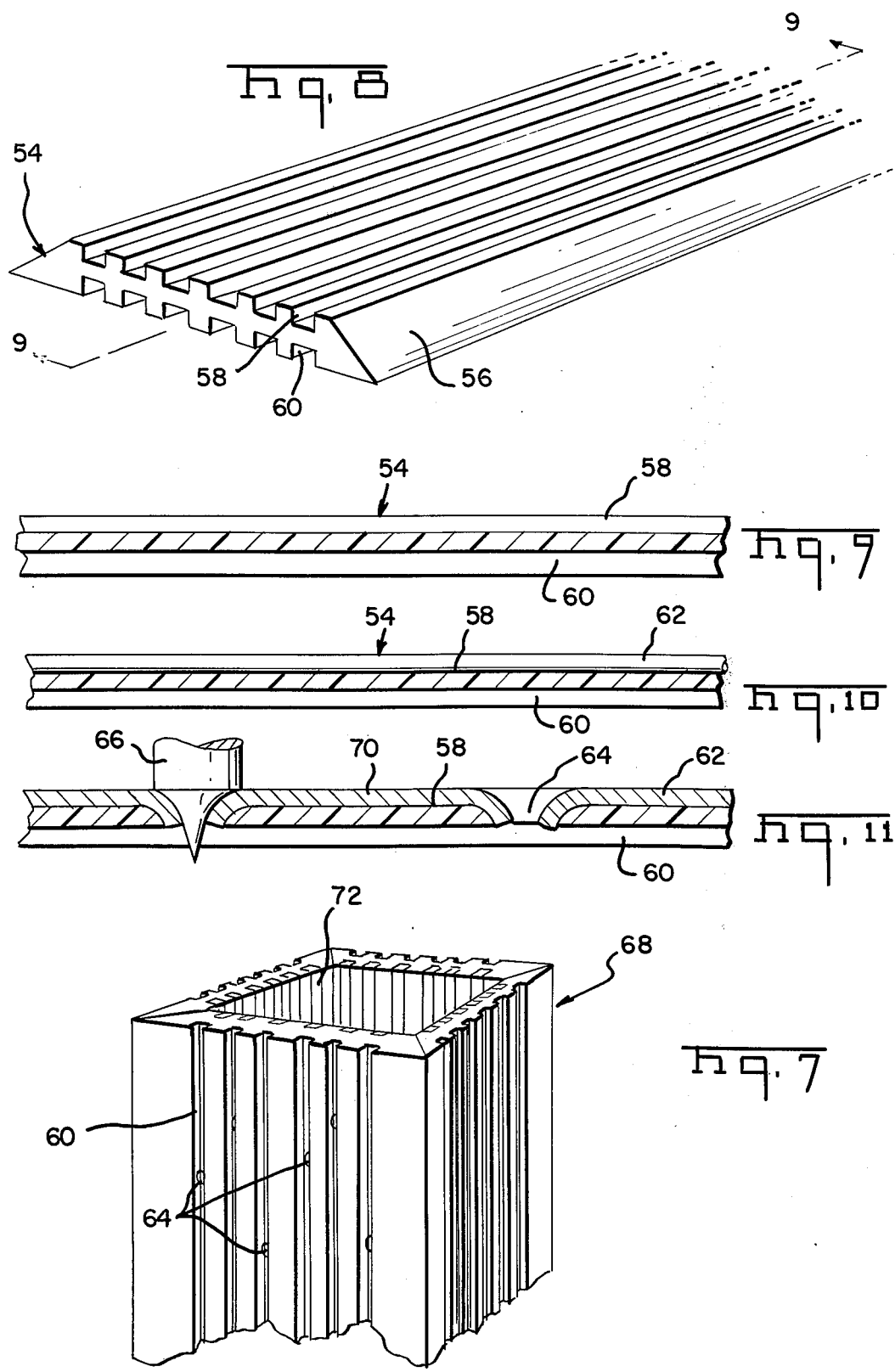

ELECTRICAL CONNECTIONS FOR CHIP CARRIERS

BACKGROUND OF THE INVENTION

This invention relates to packaging and interconnecting means for microcircuit chips which are contained in chip carriers of the general class and type now being adopted in the electronics industry.

Until fairly recent times, solid state microelectronic devices were produced with twelve or fourteen active areas and these devices were packaged in prismatic rectangular insulating bodies, dual in-line packages in DIPs, having leads from the active areas extending from two opposite sides of the rectangular bodies. More recently, microcircuit devices had been produced in the form of square chips having active areas along all four side edges thereof and these new generation chips are somewhat smaller than the previous microcircuit devices, notwithstanding the fact that the more recent chips require more leads from their active areas.

A standard packaging arrangement is being used for the newest family of microcircuit devices and is sponsored by the Electronics Industry Association and the National Electric Manufacturers Association. This standard chip carrier, and a socket which is adapted to receive the standard chip carrier, is described in *Aviation Week and Space Technology*, Jan. 24, 1977. In general, a standard chip carrier in accordance with the specifications of the associations noted above comprises a square low-profile container having at least six leads extending from all four laterally facing side surfaces thereof. It is common practice to mount chip carriers of this type directly on the printed circuit boards or to removably insert such chip carriers into chip carrier sockets, which are dimensioned to receive a single chip carrier.

It should be mentioned that in the rapidly developing microelectronics industry, added requirements are continually emerging for microcircuit chips so that a packaging arrangement which may be entirely satisfactory for the microcircuits being produced today may be totally incapable of accommodating, and providing the necessary interconnections for, the microcircuit chips which will be available only a few years hence. For example, chips such as microprocessor chips are presently being manufactured which have an information capacity of 4000 information bits (4K). Within the next few years, chips having the same dimensions as presently available chips will have a capacity of 8K and it is also foreseen that 16K bits will be available shortly thereafter. It follows that manufacturers who adopt a packaging arrangement capable of accommodating only the presently available 4K chips will be faced with a problem in the near future of changing over to a system having the capability of handling 8K bits and thereafter they will be required to again change to a system having capabilities sufficient for the 16K bits.

In accordance with one aspect of the instant invention, we provide a chip carrier socket which is capable of receiving in stacked relationship, one on top of the other, a plurality of standard chip carriers and connecting the leads of these chip carriers to the conductors on a printed circuit board or to other external conductors. When presently available chips are connected to a printed circuit board in accordance with this aspect of the invention, the present chips can be replaced by future generation chips having added information storage capacity without other significant changes to the overall packaging arrangement; thus, two 4K bits might be replaced by one 8K bit at some future time when the 8K bits become available. This changeover could be accomplished by retrofitting or alternatively as a running change in a manufacturing process. In accordance with another aspect of the invention, we provide a chip carrier socket which also functions as an interconnecting means for connecting preselected and predetermined leads of several chip carriers in a stack to each other and to the conductors of a printed circuit board. In accordance with this aspect of the invention, bus bars in the socket are selectively interrupted to achieve the desired circuit paths. In each case, the area required on the printed circuit board is substantially reduced by virtue of the stacked arrangement of the chip carriers in the socket. Other advantages which are described below are also achieved.

It is accordingly an object of the invention to provide an improved chip carrier socket. A further object is to provide a chip carrier socket capable of receiving a plurality of chip carriers. A further object is to provide an interconnecting and packaging means for a plurality of microcircuit chips. A further object is to provide an interconnecting and packaging means for a plurality of identical microcircuit chips which may, at some future time, be replaceable by a lesser number of chips, the packaging means being capable of accommodating the future generation microcircuit chips with a minimum of rearrangements of other portions of the product being manufactured.

These and other objects of the invention are achieved in preferred embodiments thereof which is briefly described in the foregoing abstract, which is described in detail below, and which is shown in the accompanying drawing in which:

FIG. 6-1 is a semidiagrammatic view showing portions of a chip carrier, portions of the chip carrier socket, and illustrating the manner in which the chipenable lead of the chip carrier is selectively connected to a dedicated conductor in the chip carrier socket.

Figure 1:
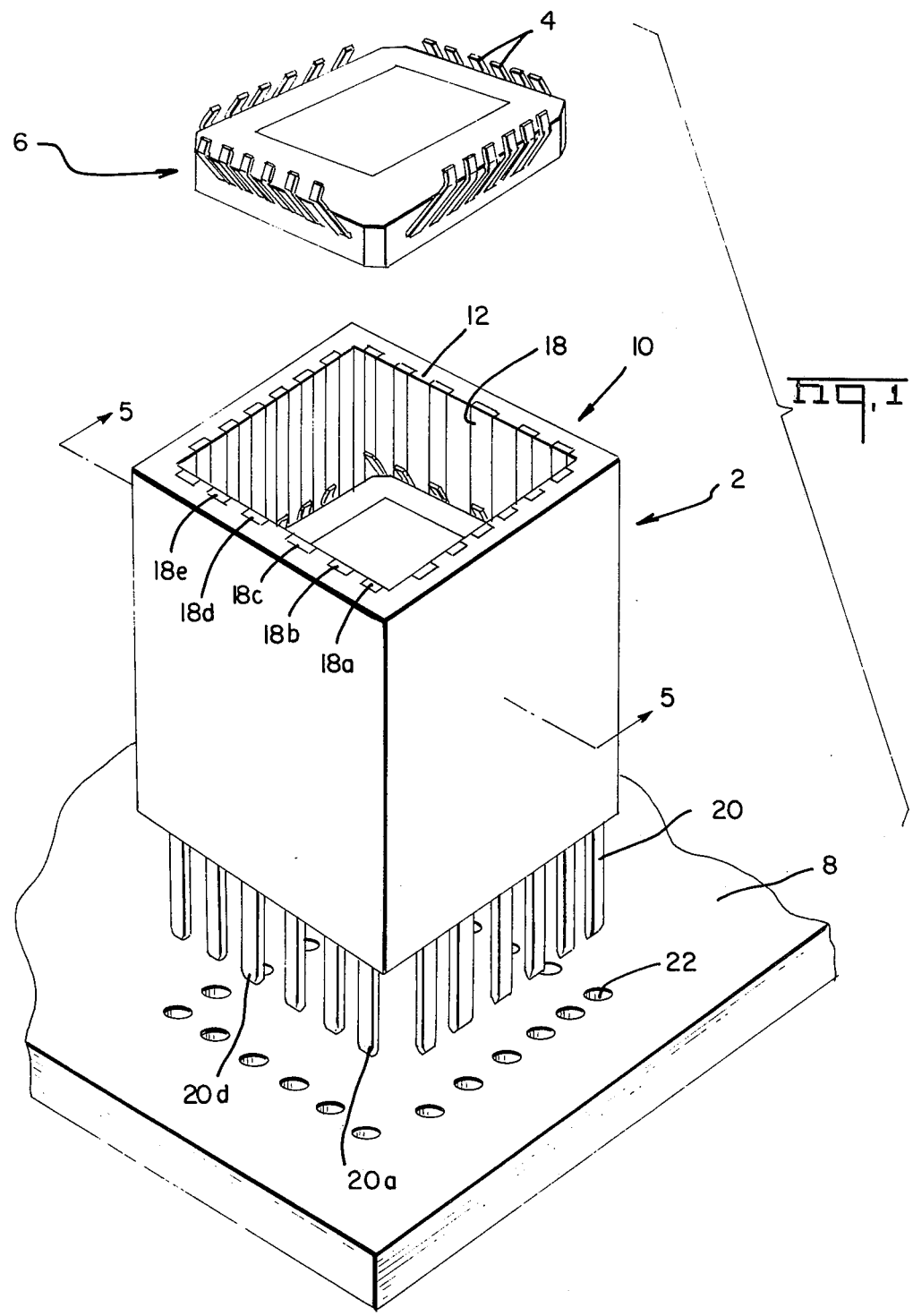
FIG. 1 is a perspective exploded view of a packaging means for a plurality of microcircuit chips in accordance with one aspect of the invention.
Figure 4:
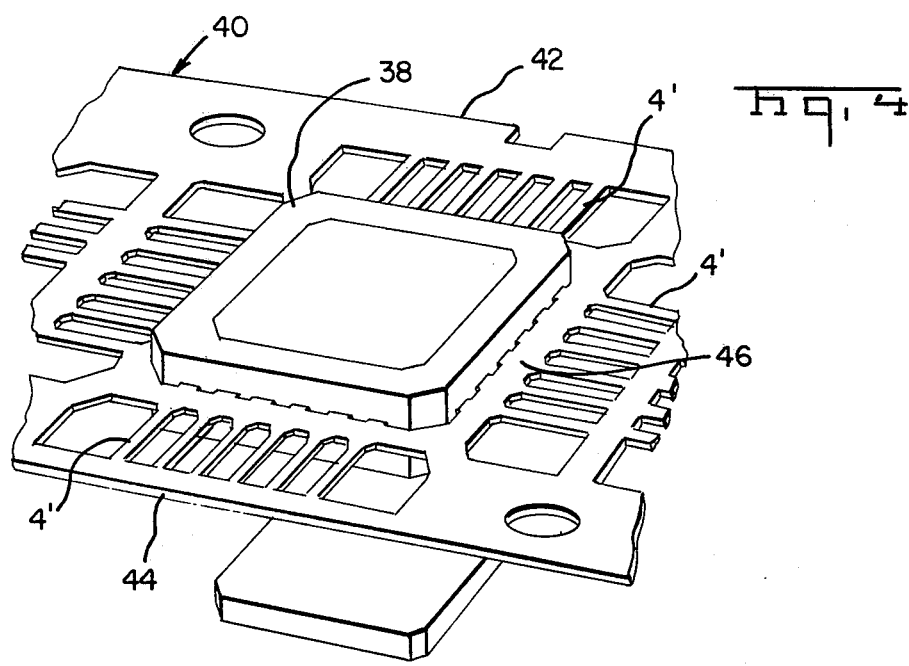
FIG. 4 is a perspective view illustrating some steps in the manufacture of a chip carrier of FIG. 2.
Figures 1, 6:
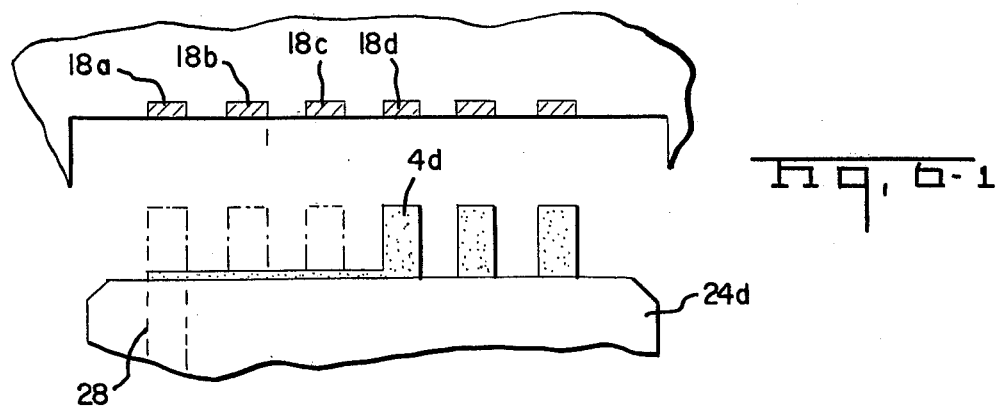
Figures 2, 6:
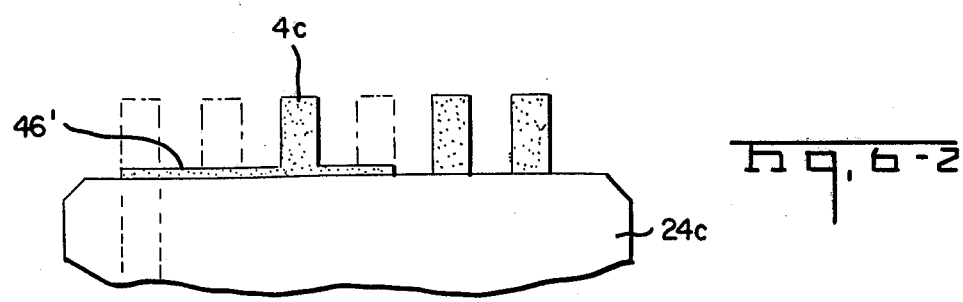
Figures 3, 6:
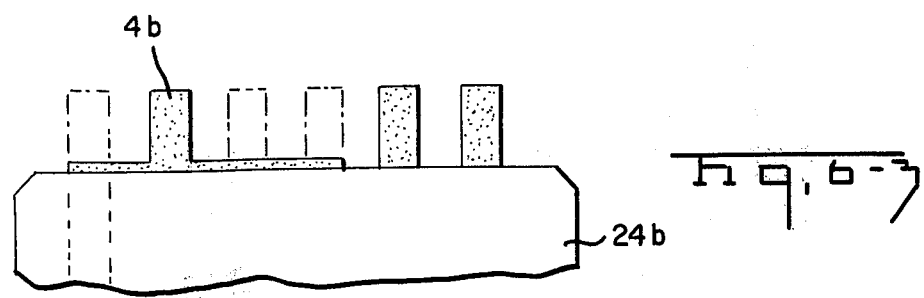
Figures 4, 6:
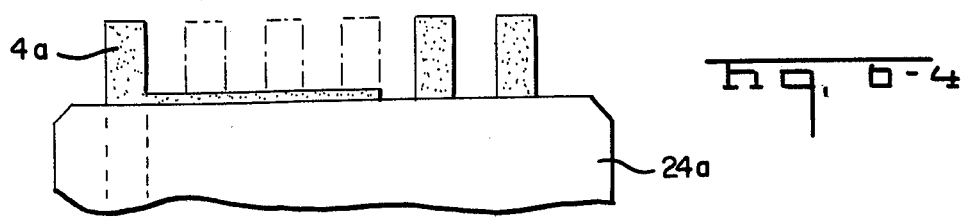

FIGS. 6-2, 6-3, and 6-4 are views similar to FIG. 6-1 illustrating the manner of selectively connecting the chipenable leads of the remaining chip carriers in the socket to their dedicated conductors in the chip carrier socket.

FIG. 7 is a perspective view of a packaging and interconnecting means in accordance with an alternative embodiment of the invention, this embodiment having the capability of making interconnections between and among the chips contained in the chip carrier socket.

FIG. 8 is a perspective view of an insulating strip which forms one side of the chip carrier socket of FIG. 7.

FIG. 9 is a view taken along the lines 9—9 of FIG. 8 showing a longitudinal connection of the strip of FIG. 8.

FIGS. 10 and 11 are views similar to FIG. 9 illustrating successive steps in the manufacture of a chip carrier socket of FIG. 7.

In accordance with the embodiment of FIGS. 1-6, the chip carrier socket 2 is provided for connecting the leads 4 of a plurality of chip carriers 6 to the conductors (not specifically shown) on a printed circuit board 8. The chip carrier socket 2 comprises an insulating housing having a square or rectangular cross section and having an open upper end 12 into which the chip carriers are inserted. The lower end of the housing is closed by a bottom cover member 14 having a central opening 16 therein to permit removal of the individual chip carriers from the interior of the socket. Vertically extending conductors 18 are provided on the internal walls of the socket and these conductors project beyond the lower end of the housing as shown at 20 so that they can be received at openings 22 in the circuit board 8 and soldered to the conductors on the underside of the board. The conductors may be of high purity copper since they do not serve as spring members but the leads 4 of the chip carrier should be of spring metal such as beryllium copper or phosphor bronze.

The chip carriers 6 which are contained in the socket 2 may be assumed to be electrically and physically identical and are dimensioned to conform to the standard dimensions for standard chip carriers as promulgated by the trade associations mentioned above. The particular chip carrier shown contains therein a microcircuit chip 24, FIG. 3, which rests upon a metallic pad 26. The pad 26 is a remnant of a lead frame 40 described below. The active areas of the chip 24 are connected by fine wires 28 to the leads 4, each of these wires being bonded to the upper surface of the chip 24 and being bonded as shown at 30 to the end of a horizontally extending portion 32 of the lead. Alternatively, the active areas can be connected to the portion 32 of the lead by thin metal foil frames as disclosed in U.S. Pat. No. 4,028,722. Each lead extends through a side wall of the chip carrier housing and externally of this wall is bent downwardly as shown at 34 and inwardly as shown at 36. When the individual chip carriers are inserted into the open upper end of the socket 2, these leads will thus contact the conductors 18 and they will be flexed inwardly towards the body of the chip carrier to maintain contact with the conductors 18.

Figure 2:
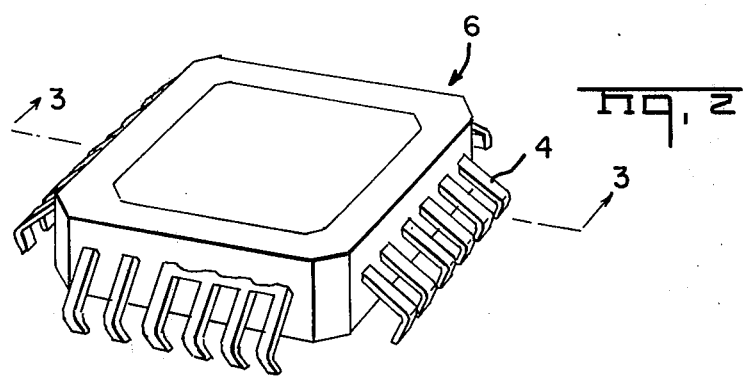
FIG. 2 is a perspective view of a chip carrier forming part of the embodiment of FIG. 1.

Chip carriers of the type shown in FIG. 2 are manufactured by first producing a continuous lead frame strip 40 having individual lead frames therein at regularly spaced intervals. Each lead frame comprises the previously identified pad 26 with leads 4' extending in all four directions from this central pad; that is, towards the side edges 42, 44 of the strip 40 and in both directions along the length of the strip. The leads 4' are severed from the pad at the time of blanking and forming the strip. Also, after stamping of the lead frame 40, web material 46 remains in surrounding relationship to the central pad 4. A square open molding 38 is thus provided on the strip in surrounding relationship to each of the pads 26. The chip 24 is then placed on the pad and the wires 28 are bonded to the chip and to the individual leads as shown at 30. Thereafter, a base member 48 is placed beneath the pad member 24, sealing material 52 is placed in the cavity, and a cover member 50 is bonded to the rectangular molded frame member 38.

Figure 3:
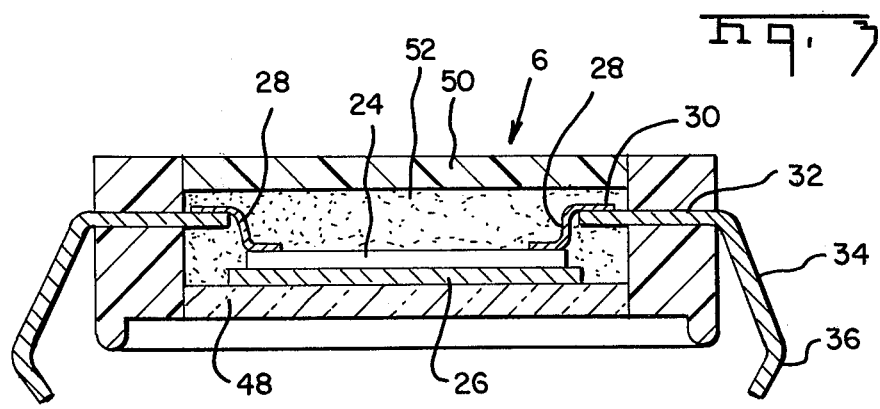
FIG. 3 is a view taken along the lines 3—3 of FIG. 2.
Figure 5:
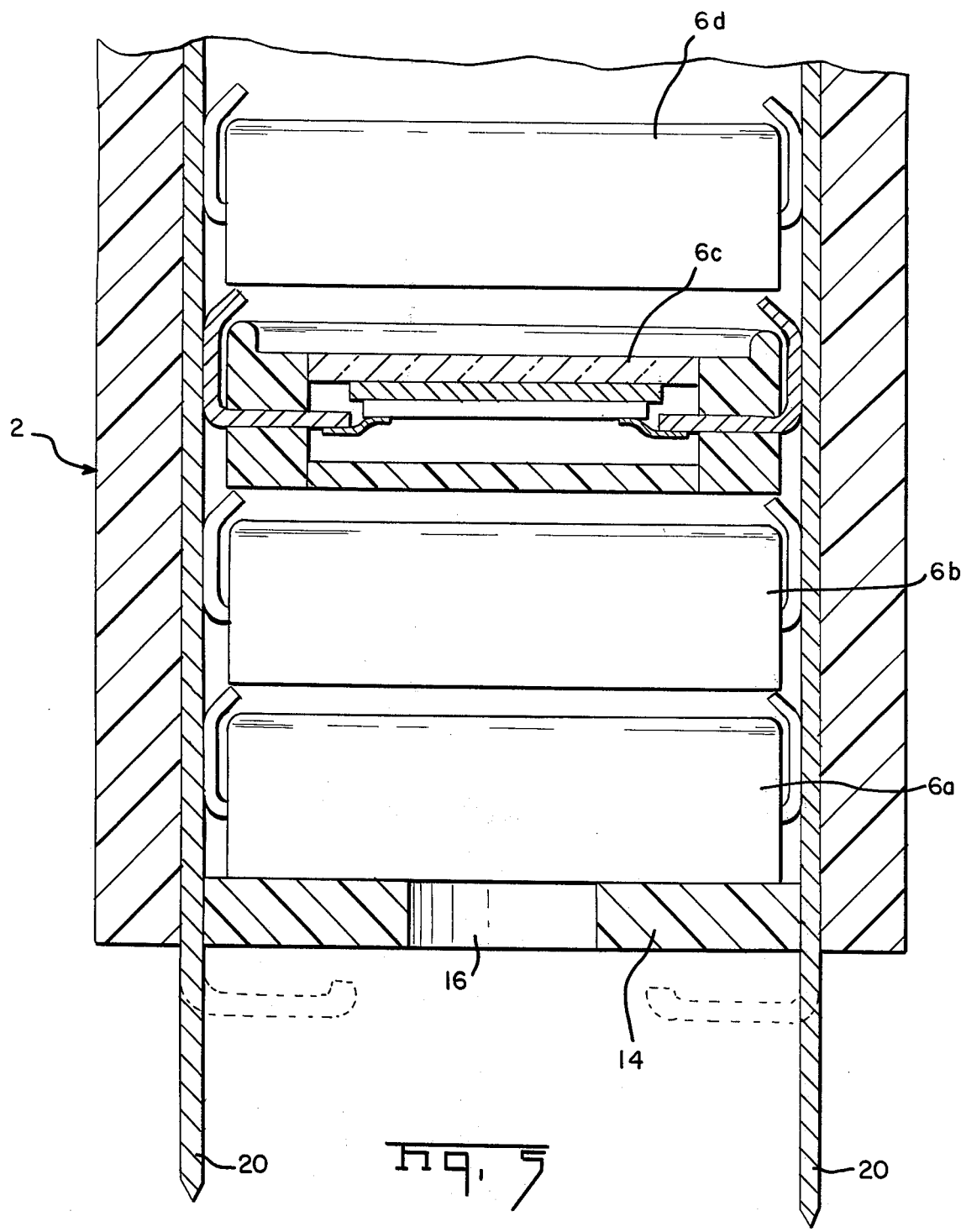
FIG. 5 is a view taken along the lines 5—5 of FIG. 1 and showing the plurality of chip carriers contained in a chip carrier socket in accordance with the invention.

After the individual chips have been placed in the frames 38 and the cover members 48, 50 have been assembled to the frames 38, the web material 46 between adjacent leads 4' is removed (with the exception of the portions 46') by a punching operation and the leads are formed downwardly to produce the configuration shown in FIG. 3.

After the web material 46 is removed, the individual leads 4 are, with exceptions about to be described, connected through the leads 28 to the active areas on the chip. It follows that if all of the chip carriers are placed in the socket member in the same orientation, corresponding leads 4 from the chip will extend to corresponding active areas on the chip and corresponding leads in the four chip carriers in the socket will be connected to the same conductor 18 in the socket 2. The four microcircuit chips in the socket are thus connected in parallel to the conductors 18 in the socket and to the conductors on the printed circuit board.

In use, only one of the chips will be energized at any particular instant during operation of the circuit. The individual chips in the four chip carriers are selectively energized by dedicated conductors specifically identified in FIG. 6-1 as 18-a, 18-b, 18-c, and 18-d for the four individual chip carriers 6-a, 6-b, 6-c, and 6-d, FIG. 5. The individual chips in the four chip carriers 24-a, 24-b, 24-c, and 24-d are selectively connected to their dedicated conductors 18-a* 18-d in the manner shown in FIGS. 6-1 to 6-4. The active areas of the four chips 24-a - 24-d are connected by conductors 28 to a portion 46' of the web material 46 which lies adjacent to one corner of the rectangular molding 38 as shown in FIG. 6-1. These connections connect the chip-enable areas of each chip to the remnant 46' of the lead frame which serves as a bus bar having the individual leads 4-a, 4-b, 4-c, and 4-d extending therefrom. Since the chip carrier 4-d is to be connected to the lead 18-d selectively, it is merely necessary to remove the leads 4-a, 4-b, and 4-c as shown in FIG. 6-1. The chip carrier 6-c is similarly connected to the conductor 18-c by removing the leads 4-a, 4-b, and 4-d and the remaining chip carriers are similarly connected to their dedicated conductors 18-a and 18-b by removing selectively three of the leads from the bus bar 46'. After three of the four leads 18-a - 18-d have been removed from each chip carrier, the chip carriers are merely inserted into the open upper end of the socket 2 and the chip-enable leads of each chip carrier will be electrically connected to suitable control circuitry. As previously mentioned, the remaining conductors 18 serve all four chips in the socket.

An immediately apparent advantage of a socket member 2 as described above is that the amount of real estate required for four chip carriers is greatly reduced as is the amount of material required to accommodate four chip carriers and the number of soldered connections (the leads 20 to the conductors on the circuit board 8). A further advantage is achieved by virtue of the flexibility of the system described as regards the type for capacity of the microcircuit chips contained in the chip carriers. For example, if it is assumed that each microcircuit chip in each of the four chip carriers has an information capacity of 4K bits and that these chips will be superseded by future chips having an information capacity of 8K bits, than the future chips can replace the present chips by simply removing the four chips in the socket at some future date and replacing them by two of the future generation chips. A similar change may be made at a later date when 16K capacity chips become available. The changes may be made by retrofitting or as running changes in a production process. Chip carrier removal is, of course, accomplished by simply pushing the chips upwardly as viewed in FIG. 5, access to the lowermost chip being provided by the opening 16.

FIGS. 7–11 show an embodiment comprising an interconnection and packaging system for packaging and forming the electrical connections between a plurality of chip carriers which are dissimilar in the sense that the individual chips carry out different electrical functions. Under such circumstances, some of the individual leads 4 of the several chips can not share vertical conductors in the chip carrier socket or the vertical conductors can be shared only to a very limited extent. The vertical conductors are, on the other hand, required to form the chip-to-chip connections in the stack contained within the socket 68. The only external conductors may, under many circumstances, be input and output conductors for the module 68.

The socket 68 of this embodiment is comprised of four sections, each of which is in the form of an elongated extrusion 54 having beveled side edges 56. Four such sections are assembled to each other with their beveled edges 56 against each other to produce the socket 68. Channels 58, 60 are provided on both surfaces of each panel member 54 and conductors, similar to the conductors 18, are mounted in the channels 58. Prior to assembly of the four panel members 54 to each other, the conductors 62 are interrupted at selected locations by punching holes 64 in the conductors with a punching tool 66. After these holes 64 have been punched in the panels, isolated conductors 70 are provided in selected locations in the socket so that when the chip carriers are inserted into the socket, the leads 4 of the chip carriers will be connected to each other in accordance with a predetermined wiring or conducting plan. Thus, a chip carrier at the upper end of the stack contained in the socket 68 might have one of its leads connected by a conductor 70 to a corresponding lead extending from the chip carrier which is next adjacent thereto. Alternatively, the selected lead 4 in the uppermost chip carrier may be selectively connected to the corresponding lead in the lowermost chip carrier of the stack by removing the corresponding leads of the second and third chip carriers. Adjacent leads 4 of an individual chip carrier can be commonly connected by leaving a portion of the web material 46 in that chip carrier. It will thus be seen that any desired interconnections can be achieved if the chip topography is designed with the packaging and interconnection method of FIGS. 7–11 in mind. The chip topography would thus be laid out in a way such that all of the designed interconnections among several chips could be achieved by punching holes 64 in the panel members 54 at appropriate locations during manufacture of the socket 68. It will be apparent that all of these operations in the production of a system contained in the well 68 could be carried out with a high degree of automation and with computer controlled manufacturing processes. The manufacture of the individual panels 54, and particularly the punching of the holes 64, can be carried out during a linear manufacturing process with the punching means 66 programmed to punch a pattern of holes in each panel member which will produce the desired end result. As previously mentioned, the input and output conductor at the lower end of the socket 68 should be located in the same positions for all sockets or at least for all sockets of a given type circuit or system.

The embodiment of FIGS. 7–11 results in a substantial saving in printed circuit board area requirements as does the embodiment of FIGS. 1–6. Additionally, an entire portion of an apparatus can be packaged within the carrier socket 68 so that it can be assembled to and removed from the circuit board as a unit.

What is claimed is:

1. A stack of chip carriers in combination with a chip carrier socket:

each of said chip carriers comprising a prismatic housing containing a microcircuit chip, each chip carrier having oppositely directed faces, laterally facing sides and having spaced-apart leads extending along said sides and between said faces, said leads extending into said housing and being connected to said microcircuit chip, one of said leads of each chip serving as a chip-enable lead, said chip-enable leads of said plurality of chip carriers being adjacent to each other on said chips, said chip carriers being substantially physically identical, said chip carrier socket comprising a prismatic body having a chip-receiving end and a chip-receiving well extending inwardly from said chip-receiving end, said well being dimensioned to receive said stack of said chip carriers with said leads against the internal walls of said well, a plurality of socket conductors extending along said internal walls, said leads being against, and in electrical contact with, said socket conductors, said conductors being connected to external circuitry which is effective selectively to energize one of said chips by transmission of a signal through the associated chip-enable lead, said conductors in said well, excepting those in contact with said chip-enable leads, serving as bus conductors for all of said chips, said plurality of chip carriers in said stack being replaceable by a lesser number of physically similar chip carriers containing chips having increased information circuit capacity.

2. A stack of chip carriers in combination with a chip carrier socket as set forth in claim 1, said leads extending from said sides of each of said chip carriers and being bent upwardly towards said chip receiving end of said chip carrier socket.

3. A stack of chip carriers in combination with a chip carrier socket as set forth in claim 2, said conductors in said well which are in contact with said chip-enable leads being side-by-side, said chip-enable leads extending from a common bus conductor in said chip carrier, said common bus conductor of each chip carrier extending to a chip-enable active zone of each chip.

4. Packaging and interconnecting means for a plurality of microcircuit chips, said packaging and interconnecting means comprising:

a plurality of chip carriers and a chip carrier socket, said chip carriers each comprising a generally prismatic housing having oppositely directed faces and laterally facing sides, each of said microcircuit chips being contained in one of said chip carriers, a plurality of contact leads on said sides of each of said chip carriers, said leads extending in parallel spaced-apart relationship between said faces, said leads extending into said housing and being electrically connected to the chip contained therein, said socket comprising an insulating body having an open end and having a chip-receiving well extending therein from said open end, said chip carriers being in stacked relationship in said well, a plurality of parallel conductors in said well extending inwardly from said open end, said conductors being spaced-apart by distances which correspond to the spacing between said contact leads, said contact leads being in electrical contact with said conductors, said conductors being selectively interrupted between adjacent chip carriers by discontinuities thereby selectively to interconnect said leads of said plurality of chips, and selected ones of said conductors extending externally of said socket and serving as input and output conductors.

5. Packaging and interconnecting means as set forth in claim 4, said leads being of stamped and formed spring metal and being remnants of a stamped and formed lead frame, selected adjacent leads in at least one of said chip carriers being connected to each other by web material which is also a remnant of a lead frame.

6. Packaging and interconnecting means as set forth in claim 5, said socket being of rectangular cross section and being comprised of four flat sections, each of which comprises one side of said socket, said discontinuities comprising punched holes in said sections.

7. A method interconnecting microcircuit chips comprising the steps of:

mounting each of said chips in a rectangular chip carrier of the type having oppositely directed faces, laterally facing sides, and parallel leads extending from said chip to said sides and along said sides between said faces, forming a plurality of flat insulating socket side panels having conductors extending along the length thereof, selectively interrupting said conductors, assembling said side panel members to each other and forming a chip carrier socket having a chip carrier receiving well and having said conductors extending along the internal sidewalls of said well, and inserting said chip carriers into said well in a predetermined order and orientation thereby selectively to interconnect said leads of said chip carriers.

* * * * *